United States Patent
Oh

(12) 
(10) Patent No.: US 6,699,751 B2
(45) Date of Patent: Mar. 2, 2004

(54) METHOD OF FABRICATING A CAPACITOR FOR SEMICONDUCTOR DEVICES

(75) Inventor: Ki-Young Oh, Chungcheongbuk-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/190,848

(22) Filed: Jul. 9, 2002

(65) Prior Publication Data

US 2002/0175363 A1 Nov. 28, 2002

Related U.S. Application Data

(62) Division of application No. 09/527,024, filed on Mar. 16, 2000, now Pat. No. 6,437,391.

(30) Foreign Application Priority Data

Mar. 16, 1999 (KR) .............................................. 99-8832

(51) Int. Cl.[7] .......................................... H01L 21/8242
(52) U.S. Cl. ...................... 438/253; 438/244; 438/387; 438/396
(58) Field of Search ............................ 438/3, 240, 250, 438/253, 254, 255, 244, 387, 396, 397, 398; 257/306, 532, 310, 311, 758

(56) References Cited

U.S. PATENT DOCUMENTS

| 5,717,236 A | | 2/1998 | Shinkawata |
| 5,825,609 A | | 10/1998 | Andricacos et al. |
| 6,156,619 A | * | 12/2000 | Chen ........................... 438/396 |
| 6,358,794 B1 | * | 3/2002 | Oh .............................. 438/253 |

* cited by examiner

*Primary Examiner*—Phat X. Cao
*Assistant Examiner*—Theresa T. Doan
(74) *Attorney, Agent, or Firm*—Birch, Stewart, Kolasch & Birch, LLP

(57) ABSTRACT

A method of fabricating a capacitor in semiconductor devices includes forming an insulating interlayer on a semiconductor substrate; forming a contact hole in the insulating interlayer to expose a portion of the semiconductor substrate; forming a plug in the contact hole to be in contact with the semiconductor substrate; forming an adhesive layer, a first barrier layer and a first lower electrode on the insulating interlayer successively; selectively removing portions of the adhesive layer, the first barrier layer and the first lower electrode to define exposed sides of the adhesive layer, the first barrier layer and the first lower electrode; forming a second barrier layer at sides of the adhesive layer; forming a second lower electrode at the sides of the first and second barrier layers; forming a dielectric layer on the first lower electrode and second lower electrode; and forming an upper electrode on the dielectric layer.

22 Claims, 6 Drawing Sheets

METHOD OF FABRICATING A CAPACITOR FOR SEMICONDUCTOR DEVICES

This application is a divisional of co-pending Application No. 09/527,024, filed on Mar. 16, 2000, U.S. Pat. No. 6,437,391, the entire contents of which are hereby incorporated by reference and for which priority is claimed under 35 U.S.C. §120; and this application claims priority under 35 U.S.C. §119 of Application No. 99-8832 filed in Korea on Mar. 16, 1999.

BACKGROUND OF THE INVENTION

1. Field of Invention

The present invention relates to a capacitor for semiconductor devices which prevents resistance between a lower electrode and a plug therein from increasing.

2. Discussion of Related Art

There has been a variety of research directed toward increasing the capacitance density of a semiconductor device in order to allow the capacitor to have a specific amount of capacitance even if the cell area becomes smaller as the device is more highly integrated. To obtain a large amount of capacitance, the lower electrode of a capacitor is configured as a three-dimensional structure such as a stacked or trench structure, enlarging the surface area of the dielectric of the capacitor. However, the stacked or trench structured capacitor is fabricated through a complicated process. Thus, there are limitations in increasing the surface area of the dielectric.

To solve this problem, there has been developed a method of enlarging the capacitance in which the dielectric is made of a substance of a high dielectric constant such as Ta2O5, PZT(Pb(Zr Ti)O3), PLZT((Pb La)(Zr Ti)O3), PNZT(Pb(Nb Zr Ti)O3), PMN(Pb(Mg Nb)O3), BST((Ba Sr)TiO3) and the like.

FIG. 1 shows a cross-sectional view of a capacitor according to a related art.

Referring to FIG. 1, an N type impurity region 13 is formed in a semiconductor substrate 11, which serves as source and drain regions of a transistor including a gate (not shown in the drawing). An insulating interlayer 15 is formed on the semiconductor substrate 11 to cover the transistor. And a contact hole 17 (see FIG. 2A) exposing the impurity region 13 is patterned in the insulating interlayer 15.

The contact hole 17 is filled with impurity doped polysilicon to form a plug 19 which is electrically connected with an impurity region 13. Specifically, the plug 19 is formed by depositing the doped polysilicon by chemical vapor deposition (hereinafter abbreviated CVD) and by etching back the doped polysilicon to expose the insulating interlayer by reactive ion etching (hereinafter abbreviated RIE).

A barrier layer 21 and a lower electrode 23 are successively deposited on the insulating interlayer 15 including the plug 19. The barrier layer 21, which is in contact with the plug 19, is made of TiN, TaN or the like. The lower electrode 23 is formed by depositing oxidation-resistant metal such as Pt, Mo, Au or another metal of which the oxide is electrically-conductive such as Ir, Ru and the like on the barrier layer 21. The barrier layer 21 prevents silicide from being formed by the reaction between the metal of the lower electrode 23 and the silicon of the plug 19. This is because silicide is easily oxidized into an insulator.

A dielectric layer 25 is formed on the insulating interlayer 15 to cover the lower electrode 23. The dielectric layer 25 is made of a substance, of which the dielectric constant is high, such as Ta2O5, BST((Ba Sr)TiO3), PZT(Pb(Zr Ti)O3), PLZT((Pb La)(Zr Ti)O3), PNZT(Pb(Nb Zr Ti)O3), PMN(Pb(Mg Nb)O3), etc. An upper electrode 27 is made of the same metal as the lower electrode 23 on the dielectric layer 25. When the lower and upper electrodes 23 and 27 are formed with oxidation-resistant metal, they are prevented from being oxidized even if they come into contact with the dielectric layer 25. Moreover, when they are made of metal of which the oxide is conductive, resistance stops increasing.

FIG. 2A to FIG. 2D show cross-sectional views of fabricating a capacitor according to the related art of FIG. 1.

Referring to FIG. 2A, an insulating interlayer 15 is formed on a P-type semiconductor substrate 11 including an N-type impurity region 13 which serves as source and drain regions of a transistor having a gate (not shown in the drawing). A contact hole 17 exposing the impurity region 13 by patterning the insulating interlayer 15 by photolothography.

Referring to FIG. 2B, impurity doped polysilicon is deposited on the insulating interlayer 15 to fill up the contact hole 17 by CVD. In this case, polysilicon is contacted with the exposed impurity region 13 through the contact hole 17. A plug 19 is formed by etching back the polysilicon to expose the insulating interlayer 15 by RIE. In this case, polysilicon remains only in the contact hole 17.

Referring to FIG. 2C, a barrier layer 21 contacted with the plug 19 is formed by depositing TiN or TaN on the insulating interlayer 15. A lower electrode 23 is formed by depositing oxidation resistant metal such as Pt, Mo, Au, etc. or another metal of which the oxide is electrically conductive such as Ir, Ru or the like on the barrier layer 21. In this case, the barrier layer 21 prevents the lower electrode 21 from being reacted with the plug 19, thereby eliminating the formation of silicide between the barrier layer 21 and the plug 19.

The lower electrode 23 and barrier layer 21 are patterned to remain at the part corresponding to the contact hole 17 by photolithography. In this case, the lower electrode 23 and barrier layer 21 are paterned to have the barrier layer 21 come into contact with the plug 19.

Referring to FIG. 2D, a dielectric layer 25 is formed by depositing a substance, of which dielectric constant is high, such as Ta2O5, BST((Ba Sr)TiO3), PZT(Pb(Zr Ti)O3), PLZT((Pb La)(Zr Ti)O3), PNZT(Pb(Nb Zr Ti)O3), PMN(Pb(Mg Nb)O3) or the like on the insulating interlayer 15 to cover the lower electrode 23. Oxidation of the lower electrode 23 made of an oxidation-resistant substance such as Pt, Mo, Au and the like is prohibited even though the lower electrode 23 is contacted with the dielectric layer 25 which includes oxygen atoms. Moreover, when the lower electrode 23 is made of metal of which the oxide is electrically conductive, resistance stops increasing because of the electric conductivity of metal oxide.

An upper electrode 27 is formed by depositing the same substance of the lower electrode 23 on the dielectric layer 25. In this case, oxidation of the upper electrode 27 made of an oxidation-resistant substance such as Pt, Mo, Au and the like is prohibited even though the upper electrode 27 is contacted with the dielectric layer 25 which includes oxygen atoms, too. Moreover, when the upper electrode 27 is made of metal of which the oxide is electrically conductive, resistance stops increasing because of the electric conductivity of metal oxide as well.

Then, the upper electrode 27 and dielectric layer 25 are patterned to remain on the corresponding part to the lower electrode 23. In this case, a portion of the dielectric layer 25 inserted between the upper and lower electrodes 27 and 23 is used as a charge-storing dielectric.

Thus, electric capacitance of a capacitor according to the related art may be increased by forming the dielectric layer with a substance of a high dielectric constant.

Unfortunately, oxygen contained in the dielectric substance having a high dielectric constant diffuses through the sides of a barrier layer to oxidize the barrier layer, thereby increasing contact resistance between the plug and the lower electrode.

Moreover, it is hard to increase electric capacitance of the capacitor due to the limited surface area of the dielectric layer between the upper and lower electrodes.

SUMMARY OF THE INVENTION

Accordingly, the present invention is directed to a capacitor for semiconductor devices and a fabricating method thereof that substantially obviate one or more of the problems due to limitations and disadvantages of the related art.

The present invention provides, in part, a capacitor of which electric capacitance is increased by increasing the surface area of a dielectric layer between upper and lower electrodes.

The present invention also provides, in part, a method of fabricating a capacitor which prevents the contact resistance between a plug and a lower electrode from increasing by prohibiting the oxidation of a barrier layer which occurs because of exposure to oxygen through the sides of the barrier layer.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention, in part, provides a capacitor that includes a semiconductor substrate, an insulating interlayer on the semiconductor substrate, the insulating interlayer having an elevated region, wherein a contact hole is formed in the elevated region of the insulating interlayer, a plug filling up the contact hole so as to be in contact with the semiconductor substrate, an adhesive layer on the insulating interlayer and in contact with the plug, a first barrier layer on a top surface of the adhesive layer and a second barrier layer at sides of the elevated region of the adhesive layer, a first lower electrode on the first barrier layer, a second lower electrode at sides of the first and second barrier layers and the insulating interlayer, a dielectric layer on the first and second lower electrodes, and an upper electrode on the dielectric layer.

In another aspect, the present invention, in part, provides a method that includes forming an insulating interlayer on a semiconductor substrate, forming a contact hole in the insulating interlayer to expose a predetermined portion of the semiconductor substrate, forming a plug in the contact hole so as to be in contact with the semiconductor substrate, forming an adhesive layer, a first barrier layer and a first lower electrode on the insulating interlayer successively, selectively removing portions of the adhesive layer, the first barrier layer, the first lower electrode and the insulating interlayer such that said adhesive layer, said first barrier layer and said first lower electrode remain on an elevated region of the insulating interlayer around the plug, the elevated region defining exposed sides of the insulating interlayer, forming a second barrier layer at sides of the adhesive layer, forming a second lower electrode at the exposed sides of the insulating interlayer and on the first and second barrier layers, forming a dielectric layer on the first and second lower electrodes, and forming an upper electrode on the dielectric layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention, wherein.

DETAILED DESCRIPTION OF PREFERRED EMBODIMENTS

Reference will now be made in detail to the preferred embodiments of the present invention, examples of which are illustrated in the accompanying drawings.

Figure 1:
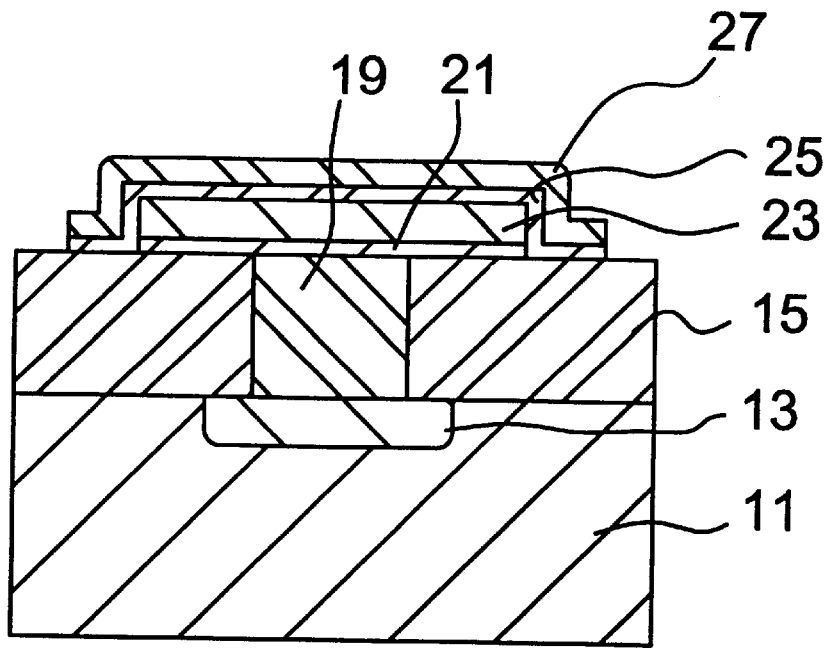
FIG. 1 shows a cross-sectional view of a capacitor according to the related art.
Figure 2A:
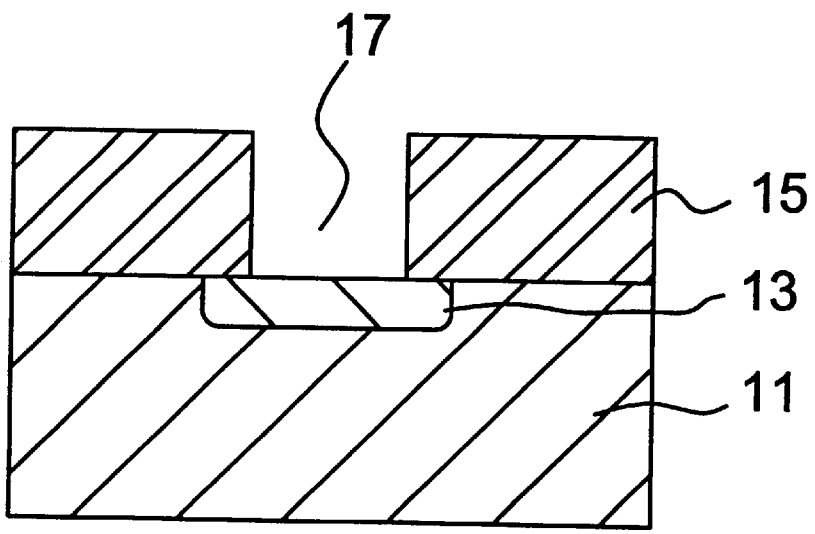
FIG. 2A to FIG. 2D show cross-sectional views of fabricating a capacitor according to a related art.
Figure 2B:
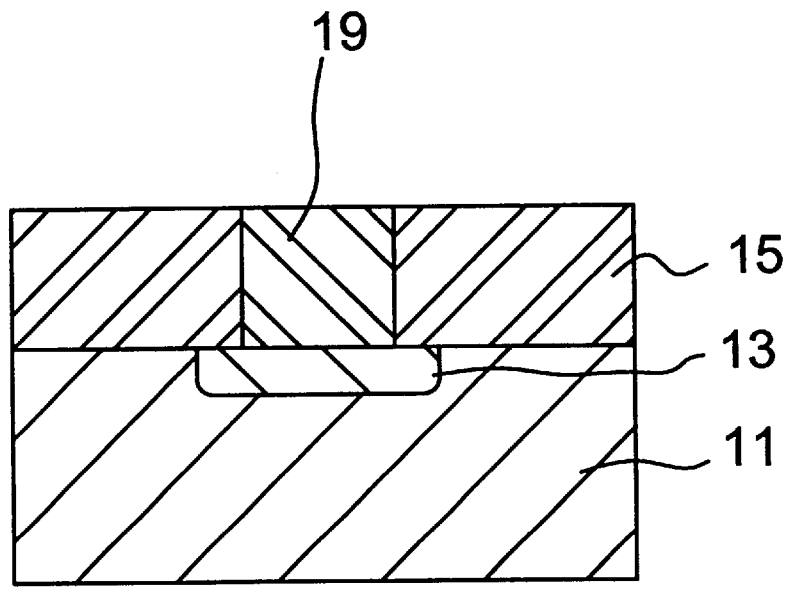
Figure 2C:
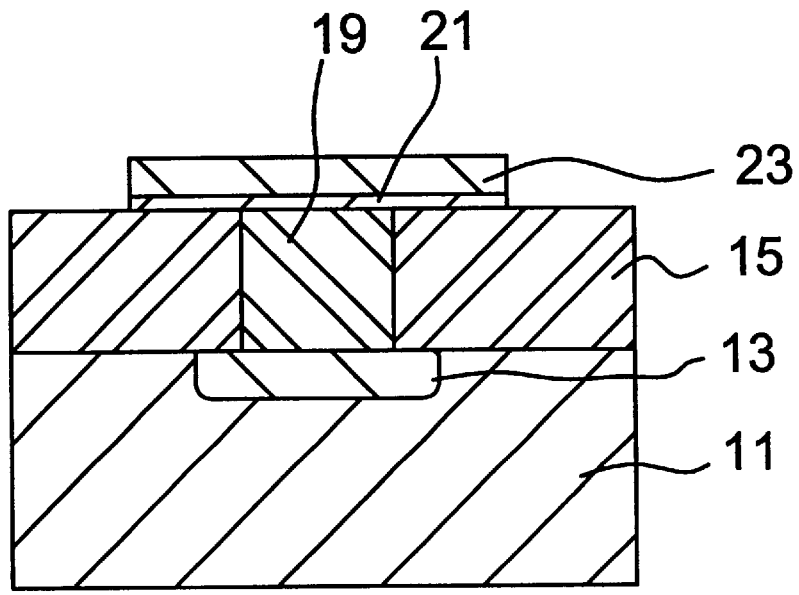
Figure 2D:
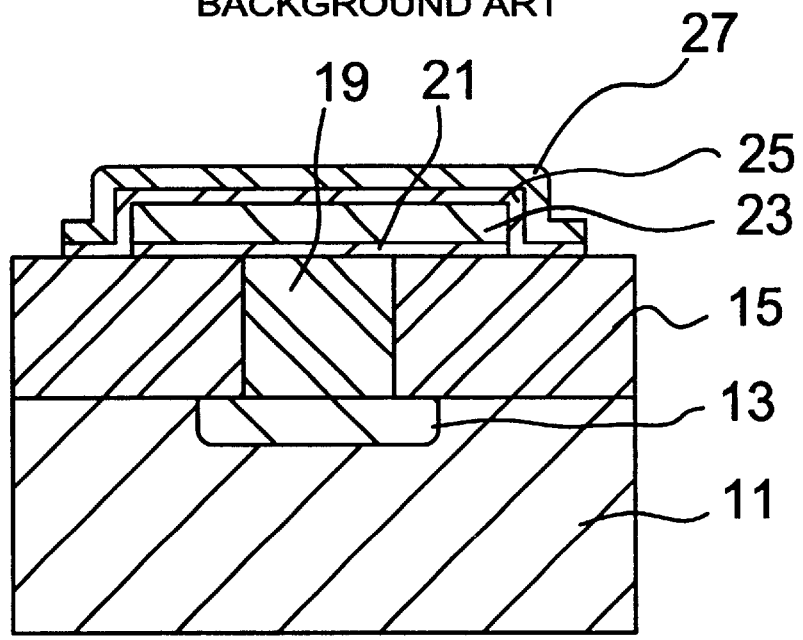
Figure 3:
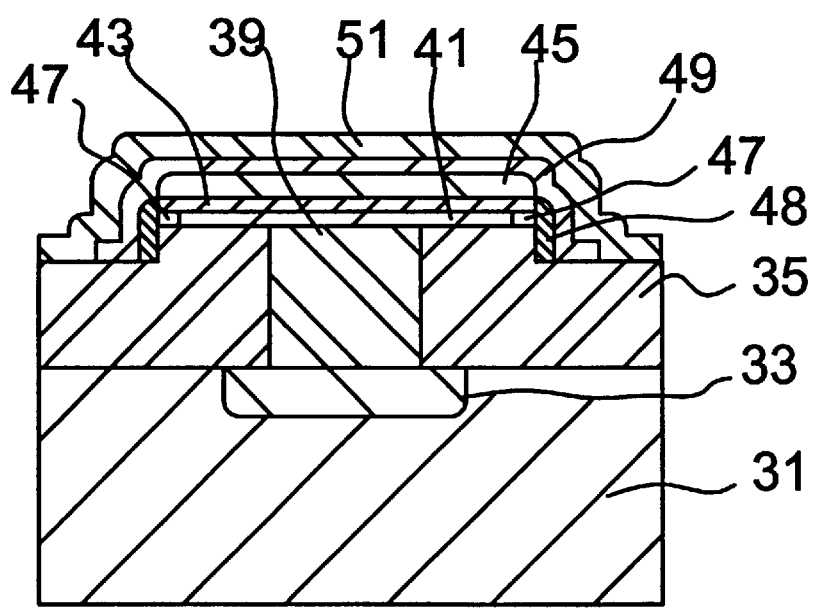
FIG. 3 shows a cross-sectional view of a capacitor according to the present invention.

FIG. 3 shows a cross-sectional view of a capacitor according to the present invention.

Referring to FIG. 3, an N-type impurity region 33 is formed in a P-type semiconductor substrate 31, which serves as source and drain regions of a transistor having a gate (not shown in the drawing). An insulating substance such as silicon oxide is deposited on the semiconductor substrate 31 by CVD, to form an insulating interlayer 35 covering the transistor. The insulating interlayer 35 is patterned to form a contact hole 37 (see FIG. 4A) exposing the impurity region 33.

A plug 39 connected electrically to the impurity region 33 is formed in the contact hole 37. In this case, the plug 39 is formed by depositing impurity-doped polysilicon on the insulating interlayer 35 by CVD to fill up the contact hole 37, and then, by etching back the impurity-doped polysilicon by RIE.

Having been deposited successively on the insulating interlayer 35 corresponding to the contact hole 37, an adhesive layer 41, a first barrier layer 43 and a first lower electrode 45 are patterned. Then, a second barrier layer 47 which prevents oxidation is formed at the sides of the adhesive layer 41.

In this case, the insulating interlayer 35 is formed to protrude laterally beyond the adhesive layer 41 by overetching the portion which does not correspond to the adhesive layer 41, the first barrier layer 43 and the first lower electrode 45.

A second lower electrode 48, the shape of which is similar to a sidewall spacer, is formed at the ends of the first and second barrier layers 43 and 47 as well as at the exposed sides where the insulating interlayer 35 has been etched.

The adhesive layer 41 is about 100 to 500 Å thick and is formed of silicide such as TiSi2, TaSi2, MoSi2, WSi2, CoSi2 and the like. In this case, the adhesive layer 41 is deposited to adhere to the plug 39 by depositing polysilicon on the insulating interlayer 35 by CVD. Successively, refractory metal such as Ti, Ta, Mo, W, Co and the like is deposited on the polysilicon. Then, the refractory metal experiences a thermal treatment. Otherwise, silicide such as TiSi2, TaSi2, MoSi2, WSi2, CoSi2 or the like is formed directly by sputtering.

The first barrier layer 43 is 50 to 200 Å thick and is formed of TiSiN, TaSiN, MoSiN, WSiN, CoSiN or the like on the adhesive layer 41. In this case, the first barrier layer 43 is formed by nitrizing a top surface of the adhesive layer 41 or by depositing one of TiSiN, TaSiN, MoSiN, WSiN, CoSiN and the like on the adhesive layer 41 by sputtering. In this case, the first barrier layer 43 prevents the first lower electrode 45 from turning into silicide by being reacted with silicon atoms in the plug 39.

The first lower electrode 45 is formed with either a refractory metal such as Pt, Mo, Au and the like or another metal of which the oxide is electrically conductive such as Ir, Ru, etc.

The second barrier layer 47 is 50 to 100 Å thick and is formed of TiSiN, TaSiN, MoSiN, WSiN, CoSiNa or the like at the exposed sides/ends of the adhesive layer 41 after it has been patterned.

In this case, the second barrier layer 47 is formed by nitrizing exposed sides/end of the adhesive layer 41 under plasma atmosphere. Thus, the adhesive layer 41 is surrounded by the first and second barrier layers 43 and 47. The second barrier layer 47 prevents the formation of silicide which is generated by reacting the second lower electrode 48 with the plug 39.

Each of the second lower electrodes 48 (the shape of which is similar to a sidewall spacer) is formed against the exposed side of the insulating interlayer 35 and against the ends of the first and second barrier layers 43 and 47, and of the same metal as the first lower electrode 45 (which is a refractory metal or another metal of which the oxide is electrically conductive). In this case, the second lower electrode 48 is formed by etching the edges of the first lower electrode 45 by enlarging the high frequency power being used when the second barrier layer 47 is formed, and then, by redepositing the etched metal thereon.

A dielectric layer 49 is formed on the insulating interlayer 35 and the first and second lower electrodes 45 and 48. In this case, the dielectric layer 49 is formed with a dielectric substance having a high dielectric constant such as Ta2O5, BST((Ba Sr)TiO3), PZT(Pb(Zr Ti)O3), PLZT((Pb La)(Zr Ti)O3), PNZT(Pb(Nb Zr Ti)O3), PMN(Pb(Mg Nb)O3) and the like. The dielectric layer 49 is likely to contain oxygen atoms. Thus, electric capacitance is increased as the dielectric layer 49 is formed on the second lower electrode 48 as well as the first 45.

Though in contact with the dielectric layer 49 (containing oxygen atoms), the first and second lower electrodes 45 and 48, which are formed with refractory a metal such as Pt, Mo, Au and the like, are very resistent to oxidation. Moreover, electric resistance stops increasing (due to oxidation) provided that the first and second lower electrodes 45 and 48 are formed with metal of which the oxide is electrically conductive.

The dielectric layer 49 is separated from the adhesive layer 41 by, among other things, the second barrier layer 47. Thus, the adhesive layer 41 is protected from exposure to oxygen componets contained in the dielectric layer 49, thus preventing oxidation and the associated increase in resistance.

An upper electrode 51 is formed on the dielectric layer 49 with the same metal used for the first and second lower electrodes 45 and 48 such as refractory metal or another metal of which the oxide is electrically conductive. Though in contact with the dielectric layer 49 (containing oxygen atoms), the upper electrode 51, which is formed with a refractory, is very resistant to oxidation. Moreover, any increase in electric resistance due to oxidation is minimized if the upper electrode 51 is formed with metal of which the oxide is electrically conductive.

FIG. 4A to FIG. 4E (show cross-sectional views of fabricating a capacitor according to the present invention.

Figure 4A:
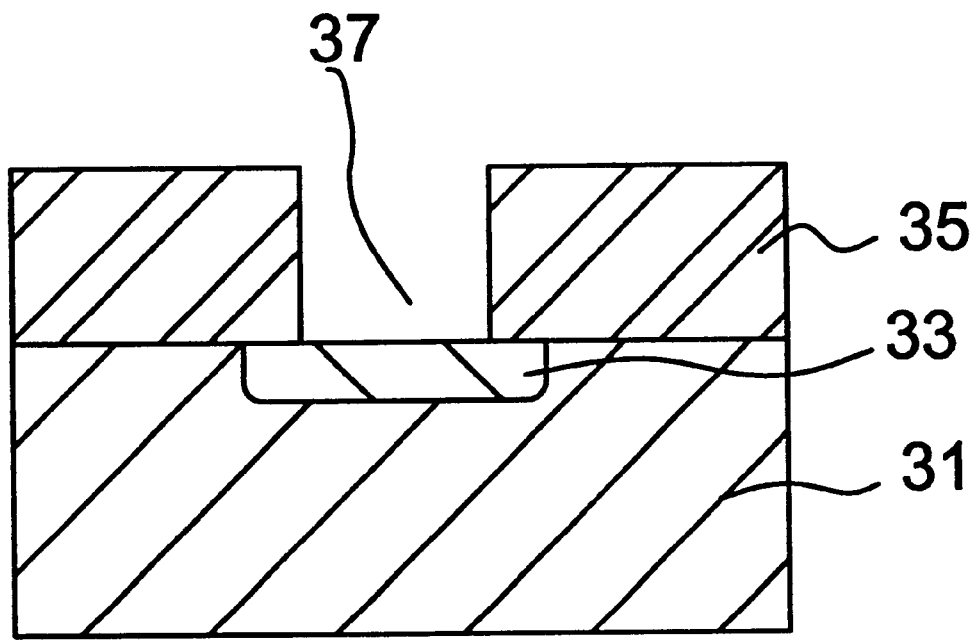
FIG. 4A to FIG. 4E show cross-sectional views of fabricating a capacitor according to the present invention.

Referring to FIG. 4A, an insulating interlayer 35 is formed by depositing an insulator such as an oxide of silicon and the like by CVD on a P-type semiconductor substrate 31 where an N-type impurity doped region 33 used as source and drain regions of a transistor having a gate (not shown in the drawing) is formed. A contact hole 37 exposing the impurity region 33 is formed by patterning the insulating interlayer 35 by photolithography.

Figure 4B:
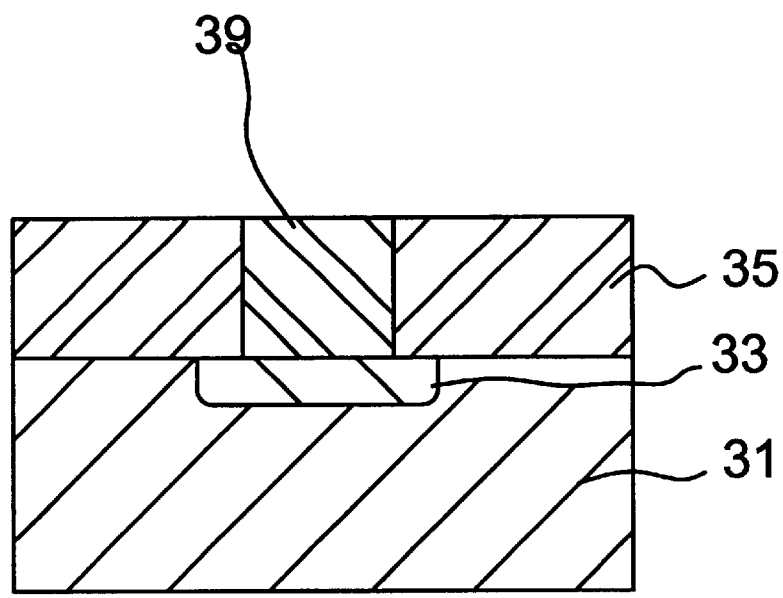

Referring to FIG. 4B, impurity doped polysilicon is deposited on the insulating interlayer 35 to cover the contact hole 37 by CVD. A plug 39, which fills up the contact hole 37 and is connected electrically to the impurity region 33, is formed by etching back the polysilicon by RIE to expose the insulating interlayer 35.

Figure 4C:
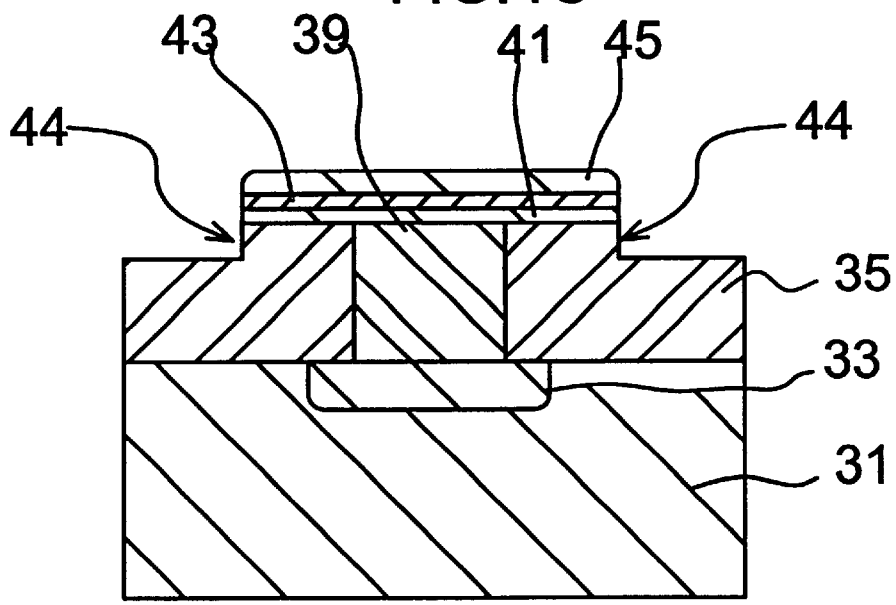

Referring to FIG. 4C, an adhesive layer 41 is formed on the insulating interlayer 35 in contact with the plug 39. In this case, the adhesive layer 41 about 100 to 500 Å thick and is formed of a silicide such as TiSi2, TaSi2, MoSi2, WSi2, CoSi2 and the like. The adhesive layer 41 is deposited to adhere to the plug 39 by depositing polysilicon on the insulating interlayer 35 by CVD. Successively, refractory metal such as Ti, Ta, Mo, W, Co and the like is deposited on the polysilicon. Then, the refractory metal experiences a thermal treatment. Otherwise, silicide such as TiSi2, TaSi2, MoSi2, WSi2, CoSi2 or the like is formed directly by sputtering.

A first barrier layer 43 about 50 to 200 Å thick is formed of TiSiN, TaSiN, MoSiN, WSiN, CoSiN or the like on the adhesive layer 41. In this case, the first barrier layer 43 is formed by nitrizing a top surface of the adhesive layer 41 by RTA (rapid thermal anneling) or plasma or by depositing one of TiSiN, TaSiN, MoSiN, WSiN, CoSiN and the like on the adhesive layer 41 by sputtering. In this case, the substrate temperature for forming the first barrier layer 43 ranges from about 400 to 500 Å.

A first lower electrode 45 about 1500 to 4000 Å thick is formed on the first barrier layer 43 by depositing either a refractory metal such as Pt, Mo, Au and the like or another metal of which the oxide is electrically conductive such as Ir, Ru, etc. by sputtering to complete an intermediate structure. In this case, the first barrier layer 43 prevents the first lower electrode 45 from forming a silicide at the interface between the adhesive layer 41 and the plug 39 by being reacted with the plug 39.

The first lower electrode 45, the first barrier layer 43 and the adhesive layer 41 are patterned to remain on a part of the insulating interlayer 35 corresponding to the contact hole 37 by photolithography. In this case, when the first lower electrode 45, the first barrier layer 43 and the adhesive layer 41 are etched, the insulating interlayer 35 is also over etched to cause the intermediate structure to take on an inverted T-shape. There, the width of the body of the T-shape corresponds to the width of the layers 41, 43 and 45, resulting in exposed edges 44 of the insulating interlayer 35.

Alternatively, the insulating interlayer 35 does not need to be overetched (not depicted). In that situation, the surface of the insulating interlayer 35 would be at the same level aside the second barrier layer 47 as it is below the second barrier layer 47 and the adhesive layer 41. This is less preferred because the size of the corresponding second lower electrode 48 would be smaller. Even further in the alternative (and least preferred), the second lower electrode 48 can be omitted.

Figure 4D:
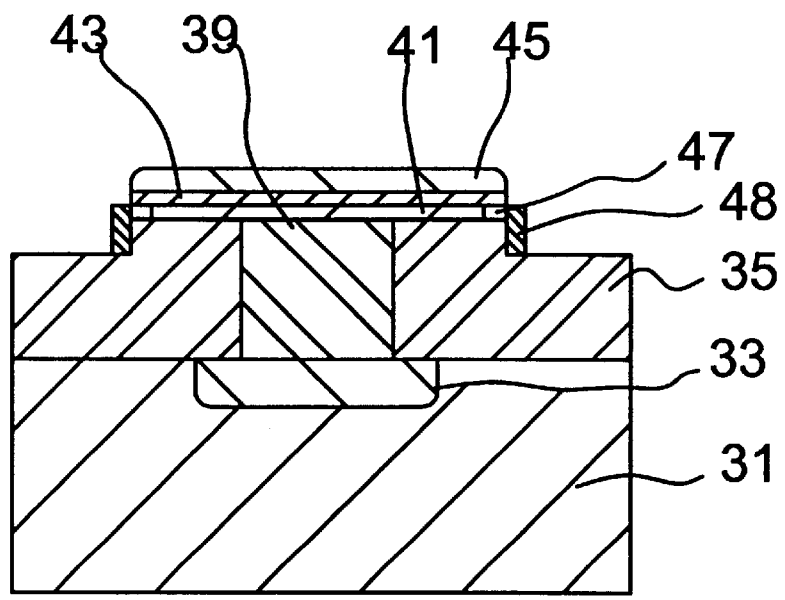

Referring to FIG. 4D, a layer 47 of TiSiN, TaSiN, MoSiN, WSiN, CoSiN or the like which is about 50~100 Å thick is formed at the exposed end of the adhesive layer 41.

For example, the layer 47 is a second barrier layer formed by nitrizing the exposed end of the adhesive layer 41 under a plasma atmosphere.

A second lower electrode 48, that resembles a sidewall spacer, is formed against the side 44 of the insulating interlayer 35 and against the ends of first and second barrier layers 43 and 47 using the same metal of the first lower electrode 45, which is the refractory metal or other metal of which the oxide is electrically conductive. In this case, the second lower electrode 48 is formed by etching the edges of the first lower electrode 45 by applying radio frequency power ranging from about 500 to 1000 W when the second barrier layer 47 is formed, and then, by redepositing the etched metal thereon. Redeposited on the insulating interlayer 35, metal having been etched at the first lower electrode 45 is re-etched. Therefore, the effective area of a lower electrode of a capacitor is increased by the second lower electrode 48.

Figure 4E:
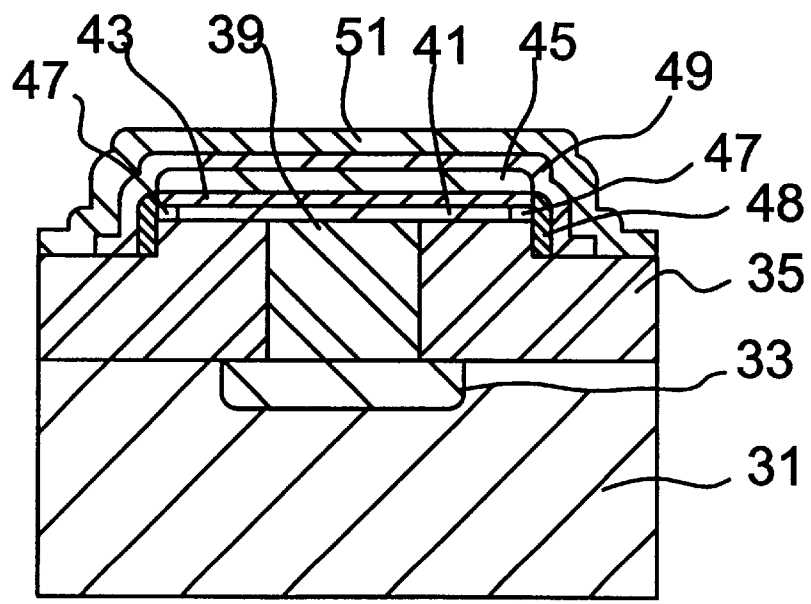

Referring to FIG. 4E, a dielectric layer 49 covering the first and second lower electrodes 45 and 48 are formed on the insulating interlayer 35. In this case, the dielectric layer 49 is about 300 to 1000 Å thick and is formed with a dielectric substance of which dielectric constant is high, such as Ta2O5, BST((Ba Sr)TiO3), PZT(Pb(Zr Ti)O3), PLZT((Pb La)(Zr Ti)O3), PNZT(Pb(Nb Zr Ti)O3), PMN(Pb (Mg Nb)O3) and the like. Thus, electric capacitance is increased as the dielectric layer 49 is formed on the second lower electrode 48 as well as the first lower electrode 45.

The dielectric layer 49 may be formed with a high dielectric substance by sputtering under an oxygen atmosphere at 300 to 600 Å, by MOCVD (Metal Organic Chemical Vapor Deposition) or by sol-gel coating and annealing under an oxygen atmosphere at 400 to 600 Å.

Though in contact with the dielectric layer 49 (containing oxygen atoms), the first and second lower electrodes 45 and 48, which are formed with refractory a metal, are very resistent to oxidation. Moreover, electric resistance stops increasing (due to oxidation) provided that the first and second lower electrodes 45 and 48 are formed with metal of which the oxide is electrically conductive such as Ir, Ru and the like. And, the dielectric layer 49 is separated from the adhesive layer 41 by, among other things, the second barrier layer 47, preventing contact resistance between the plug 39 and the first lower electrode 45 from increasing (due to oxidation by exposure to oxygen in the dielectric layer 49.

An upper electrode 51 about 1000 to 2000 Å thick is formed on the dielectric layer 49 by depositing a refractory metal such as Pt, Mo, Au and the like or another metal of which the oxide is electrically conductive such as Ir Ru, etc. by sputtering.

The upper electrode 51 and the dielectric layer 49 are patterned to remain at the parts corresponding to the first and second lower electrodes 45 and 48.

In this case, electric capacitance is increased by the second lower electrode 48 as the dielectric layer 49 is formed on the second lower electrode 48 as well as the first 45 to increase an effective area of a lower electrode of a capacitor.

Accordingly, a second barrier layer of the present invention prevents an adhesive layer from being oxidized by an oxygen-containing dielectric layer, thus preventing an increase in resistance between a plug and a lower electrode due to oxidation.

Moreover, electric capacitance of the present invention is increased by enlarging the area of a dielectric layer by an amount corresponding to the second lower electrode.

It will be apparent to those skilled in the art that various modifications and variations can be made in a capacitor in semiconductor devices and a fabricating method thereof of the present invention without departing from the spirit or scope of the inventions. Thus, it is intended that the present invention cover the modifications and variations of this invention provided they come within the scope of the appended claims and equivalents.

What is claimed is:

1. A method of fabricating a capacitor for semiconductor devices, comprising:

forming an insulating interlayer on a semiconductor substrate;

forming a contact hole in the insulating interlayer to expose a predetermined portion of the semiconductor substrate;

forming a plug in the contact hole so as to be in contact with the semiconductor substrate;

forming an adhesive layer, a first barrier layer and a first lower electrode on the insulating interlayer successively;

selectively removing portions of the adhesive layer, the first barrier layer, the first lower electrode and the insulating interlayer such that said adhesive layer, said first barrier layer and said first lower electrode remain on an elevated region of the insulating interlayer around the plug, the elevated region defining exposed sides of the insulating interlayer;

forming a second barrier layer at sides of the adhesive layer;

forming a second lower electrode at the exposed sides of the insulating interlayer and on the first and second barrier layers;

forming a dielectric layer on the first and second lower electrodes; and forming an upper electrode on the dielectric layer.

2. The method according to claim 1, wherein the adhesive layer is formed with TiSi2, TaSi2, MoSi2, WSi2 or CoSi2.

3. The method according to claim 2, wherein the adhesive layer is formed by depositing polysilicon on the insulating interlayer, by depositing metal and by carrying out thermal treatment.

4. The method of claim 3, wherein the metal is Ti, Ta, Mo, W or Co.

5. The method according to claim 2, wherein the adhesive layer is formed by depositing silicide by sputtering.

6. The method of claim 5, wherein the silicide is TiSi2, TaSi2, MoSi2, WSi2 or CoSi2.

7. The method according to claim 1, wherein the first barrier layer is formed with TiSiN, TaSiN, MoSiN, WSiN or CoSiN.

8. The method according to claim 7, wherein the first barrier layer is formed by nitrizing a top surface of the adhesive layer.

9. The method according to claim 8, wherein the first barrier layer is formed by nitrizing a top surface of the adhesive layer at 700 to 1000 Å for 10 to 60 seconds by rapid thermal annealing.

10. The method according to claim 8, wherein the first barrier layer is formed by nitrizing a top surface of the adhesive layer at 300 to 500 Å for 1 to 5 minute(s) in use of plasma.

11. The method according to claim 7, wherein the first barrier layer is formed by sputtering.

12. The method according to claim 1, wherein the first lower electrode is formed by depositing refractory metal.

13. The method according to claim 12, wherein the refractory metal is Pt, Mo or Au.

14. The method according to claim 12, wherein the refratory metal is Ir or Ru.

15. The method of claim 12, wherein the refractory metal is Pt, Mo, It, Ru or Au.

16. The method according to claim 1, wherein the second barrier layer is formed with TiSiN, TaSiN, MoSiN, WSiN or CoSiN.

17. The method according to claim 16, wherein the second barrier layer is formed to a thickness 50 to 100 Å.

18. The method according to claim 17, wherein the second barrier layer is formed by nitrization under a plasma state.

19. The method according to claim 18, wherein the plasma state is achieved by applying radio frequency power ranging from 500 to 1000W.

20. The method according to claim 1, wherein the second lower electrode is formed by redepositing metal which is etched away from edges of the first lower electrode by a radio frequency power applied when the second barrier layer is formed.

21. The method according to claim 1, wherein the dielectric layer is formed with a high dielectric substance.

22. The method of claim 21, wherein the dielectric layer is Ta2O5, PZT(Pb(Zr Ti)O3), PLZT((Pb La)(Zr Ti)O3), PNZT(Pb(Nb Zr Ti)O3), PMN(Pb(Mg Nb)O3) or BST((Ba Sr)TiO3).

* * * * *